United States Patent
di Vincenzo et al.

(10) Patent No.: US 12,236,992 B2
(45) Date of Patent: Feb. 25, 2025

(54) REFRESH DETERMINATION USING MEMORY CELL PATTERNS

(71) Applicant: Micron Technology, Inc., Boise, ID (US)

(72) Inventors: Umberto di Vincenzo, Capriate San Gervasio (IT); Ferdinando Bedeschi, Biassono (IT); Christian Marc Benoit Caillat, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 131 days.

(21) Appl. No.: 17/852,221

(22) Filed: Jun. 28, 2022

(65) Prior Publication Data

US 2023/0420025 A1    Dec. 28, 2023

(51) Int. Cl.
*G11C 11/40*      (2006.01)
*G11C 11/406*     (2006.01)
*G11C 11/4074*    (2006.01)
*G11C 11/4096*    (2006.01)

(52) U.S. Cl.
CPC .. *G11C 11/40615* (2013.01); *G11C 11/40622* (2013.01); *G11C 11/4074* (2013.01); *G11C 11/4096* (2013.01)

(58) Field of Classification Search
CPC ........ G11C 11/40615; G11C 11/40622; G11C 11/4074; G11C 11/4096
See application file for complete search history.

(56) References Cited

U.S. PATENT DOCUMENTS

| | | | |
|---|---|---|---|
| 7,810,032 B2 | 10/2010 | Bauchot et al. | |
| 10,431,301 B2 | 10/2019 | Mirichigni et al. | |
| 10,566,052 B2 | 2/2020 | Mirichigni et al. | |
| 10,600,480 B2 | 3/2020 | Mirichigni et al. | |
| 2012/0221917 A1* | 8/2012 | Bueb | H03M 13/6325 714/755 |
| 2019/0243708 A1* | 8/2019 | Cha | G11C 11/4096 |
| 2022/0050748 A1* | 2/2022 | Kim | G11C 11/4087 |
| 2023/0067396 A1 | 3/2023 | Sarpatwari et al. | |
| 2023/0110946 A1 | 4/2023 | Muzzetto et al. | |
| 2023/0386543 A1* | 11/2023 | Tran | G06F 11/1044 |
| 2023/0395147 A1 | 12/2023 | Di Vincenzo et al. | |
| 2024/0071488 A1 | 2/2024 | Bedeschi | |

FOREIGN PATENT DOCUMENTS

WO        2021229260        11/2021

* cited by examiner

*Primary Examiner* — Mohammed A Bashar
(74) *Attorney, Agent, or Firm* — Greenberg Traurig (57) ABSTRACT

A system includes a memory array having pattern cells and data cells. The pattern cells are configured to store only a first logic state. The data cells are configured to store the first logic state or a second logic state. Bias circuitry is configured to apply voltages to the pattern cells and data cells. Sensing circuitry is configured to read the pattern cells. A controller is configured to apply, using the bias circuitry, first voltages to the pattern cells; determine, using the sensing circuitry, that at least a portion of the pattern cells switch; determine, based on the portion of the pattern cells that switch, to refresh a codeword; and apply, using the bias circuitry, the refresh of the codeword.

21 Claims, 6 Drawing Sheets

REFRESH DETERMINATION USING MEMORY CELL PATTERNS

FIELD OF THE TECHNOLOGY

At least some embodiments disclosed herein relate generally to memory devices. More particularly, embodiments disclosed herein relate to refreshes in memory devices.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

A storage device is an example of a memory device. Typical computer storage devices have controllers that receive data access requests from host computers and perform programmed computing tasks to implement the requests in ways that may be specific to the media and structure configured in the storage devices. In one example, a memory controller manages data stored in memory and communicates with a computer device. In some examples, memory controllers are used in solid state drives for use in mobile devices or laptops, or media used in digital cameras.

Firmware can be used to operate a memory controller for a particular storage device. In one example, when a computer system or device reads data from or writes data to a memory device, it communicates with the memory controller.

Memory devices typically store data in memory cells. In some cases, memory cells exhibit non-uniform, variable electrical characteristics that may originate from various factors including statistical process variations, cycling events (e.g., read or write operations on the memory cells), or a drift (e.g., a change in resistance of a chalcogenide alloy), among others.

In one example, reading a set of data (e.g., a codeword, a page) is carried out by determining a read voltage (e.g., an estimated median of threshold voltages) of memory cells that store the set of data. In some cases, a memory device may include an array of PCM cells arranged in a 3D architecture, such as a cross-point architecture to store the set of data. PCM cells in a cross-point architecture may represent a first logic state (e.g., a logic 1, a SET state) associated with a first set of threshold voltages, or a second logic state (e.g., a logic 0, a RESET state) associated with a second set of threshold voltages. In some cases, data may be stored using encoding (e.g., error correction coding (ECC)) to recover data from errors in the data stored in the memory cells.

For resistance variable memory cells (e.g., PCM cells), one of a number of states (e.g., resistance states) can be set. For example, a single level cell (SLC) may be programmed to one of two states (e.g., logic 1 or 0), which can depend on whether the cell is programmed to a resistance above or below a particular level. As an additional example, various resistance variable memory cells can be programmed to one of multiple different states corresponding to multiple data states, e.g., 10, 01, 00, 11, 111, 101, 100, 1010, 1111, 0101, 0001, etc. Such cells may be referred to as multi state cells, multi-digit cells, and/or multi-level cells (MLCs).

The state of a resistance variable memory cell can be determined (e.g., read) by sensing current through the cell responsive to an applied interrogation voltage. The sensed current, which varies based on the resistance of the cell, can indicate the state of the cell (e.g., the binary data stored by the cell). The resistance of a programmed resistance variable memory cell can drift (e.g., shift) over time. Resistance drift can result in erroneous sensing of a resistance variable memory cell (e.g., a determination that the cell is in a state other than that to which it was programmed, among other issues).

A PCM cell, for example, may be programmed to a reset state (amorphous state) or a set state (crystalline state). A reset pulse (e.g., a pulse used to program a cell to a reset state) can include a relatively high current pulse applied to the cell for a relatively short period of time such that the phase change material of the cell melts and rapidly cools, resulting in a relatively small amount of crystallization. Conversely, a set pulse (e.g., a pulse used to program a cell to a set state) can include a relatively lower current pulse applied to the cell for a relatively longer time interval and with a slower quenching speed, which results in an increased crystallization of the phase change material.

A programming signal can be applied to a selected memory cell to program the cell to a target state. A read signal can be applied to a selected memory cell to read the cell (e.g., to determine the state of the cell). The programming signal and the read signal can be current and/or voltage pulses, for example.

BRIEF DESCRIPTION OF THE DRAWINGS

The embodiments are illustrated by way of example and not limitation in the figures of the accompanying drawings in which like references indicate similar elements.

DETAILED DESCRIPTION

The following disclosure describes various embodiments for memory devices that use multiple patterns to determine whether a refresh is needed in a memory array (e.g., a three-dimensional cross-point memory array). At least some embodiments herein relate to memory devices that use bipolar operations for a memory array. In one example, bipolar select voltages are used to select memory cells of the memory array. In one example, the memory cells are arranged in a cross-point architecture. In one example, each memory cell is formed using a single select device. In one example, the select device includes a chalcogenide material that snaps when a sufficient voltage is applied across the memory cell.

The memory device may, for example, store data used by a host device (e.g., a computing device of an autonomous vehicle, or another computing device that accesses data stored in the memory device). In one example, the memory device is a solid-state drive mounted in an electric vehicle.

In some cases, a memory device may include an array of memory cells arranged in a three-dimensional (3D) architecture, such as a cross-point architecture, to store the set of data. The memory cells in a cross-point architecture may, for example, represent a first logic state (e.g., a logic 0, a RESET state) associated with a first set of threshold voltages, or a second logic state (e.g., a logic 1, a SET state) associated with a second set of threshold voltages.

In other embodiments, the memory cells may be arranged in a three-dimensional (3D) vertical architecture. A 3D vertical architecture may include memory cells located at the crossing between a vertical access line (e.g., a bitline pillar), and each one of a plurality of second access lines (e.g., wordlines), formed in horizontal planes or decks parallel to each other.

More generally, an integrated circuit memory cell, such as a memory cell in a cross-point memory or a 3D vertical array, can be programmed to store data by the way of its state at a voltage applied across the memory cell. For example, if a memory cell is configured or programmed in such a state that allows a substantial current to pass the memory cell at a voltage in a predefined voltage region, the memory cell is considered to have been configured or programmed to store a first bit value (e.g., one or zero); and otherwise, the memory cell is storing a second bit value (e.g., zero or one).

Optionally, a memory cell can be configured or programmed to store more than one bit of data by being configured or programmed, for example, to have a threshold voltage in one of more than two separate voltage regions.

The threshold voltage of a memory cell is such that when the voltage applied across the memory cell is increased to above the threshold voltage, the memory cell changes rapidly or abruptly, snaps (e.g., for a chalcogenide memory cell), or jumps from a non-conductive state to a conductive state. The non-conductive state allows a small leak current to go through the memory cell; and in contrast, the conductive state allows more than a threshold amount of current to go through. Thus, a memory device can use a sensor (e.g., sense amplifier) to detect the change, or determine the conductive/non-conductive state of the memory device at one or more applied voltages, to evaluate or classify the level of the threshold voltage of the memory cell and thus its stored data.

The threshold voltage of a memory cell being configured/ programmed to be in different voltage regions can be used to represent different data values stored in the memory cell. For example, the threshold voltage of the memory cell can be programmed to be in any of four predefined voltage regions; and each of the regions can be used to represent the bit values of a different two-bit data item. Thus, when given a two-bit data item, one of the four voltage regions can be selected based on a mapping between two-bit data items and voltage regions; and the threshold voltage of the memory cell can be adjusted, programmed, or configured to be in the selected voltage region to represent or store the given two-bit data item. To retrieve, determine, or read the data item from the memory cell, one or more read voltages can be applied across the memory cell to determine which of the four voltage regions contain the threshold voltage of the memory cell. The identification of the voltage region that contains the threshold voltage of the memory cell provides the two-bit data item that has been stored, programmed, or written into the memory cell.

For example, a memory cell can be configured or programmed to store a one-bit data item in a Single Level Cell (SLC) mode, or a two-bit data item in a Multi-Level Cell (MLC) mode, or a three-bit data item in a Triple Level Cell (TLC) mode, or a four-bit data item in Quad-Level Cell (QLC) mode.

The threshold voltage of a memory cell can change or drift over a period of time, usage, and/or read operations, and in response to certain environmental factors, such as temperate changes. The rate of change or drift can increase as the memory cell ages. The change or drift can result in errors in determining, retrieving, or reading the data item back from the memory cell.

Random errors in reading memory cells can be detected and corrected using redundant information. Data to be stored into memory cells can be encoded to include redundant information to facilitate error detection and recovery. When data encoded with redundant information is stored in a memory sub-system, the memory sub-system can detect errors in data represented by the voltage regions of the threshold voltages of the memory cells and/or recover the original data that is used to generate the data used to program the threshold voltages of the memory cells. The recovery operation can be successful (or have a high probability of success) when the data represented by the threshold voltages of the memory cells and thus retrieved directly from the memory cells in the memory sub-system contains fewer errors, or the bit error rate in the retrieved data is low and/or when the amount of redundant information is high. For example, error detection and data recovery can be performed using techniques such as Error Correction Code (ECC), Low-Density Parity-Check (LDPC) code, etc.

When the data retrieved from the memory cells of the memory sub-system has too many errors for successful decoding, the memory sub-system may retry the execution of the read command. Voltage pulses applied during read retry can cause threshold voltages previously programmed into separate regions to move closer to each other and into a common region and thus reduce the readability of memory cells.

Read retry can be used in memory operation systems to perform a re-read operation on a target codeword (CW), with the desired goal of achieving various benefits including error correction, re-programming, etc. In some cases, a read retry may be triggered directly after determining that fails from reading a codeword are beyond an ECC tolerance (e.g., a tolerance threshold). In one example of a codeword (CW)

read from a chalcogenide memory array, if a memory device is implementing bipolar read, bits of different states can have been affected by different drift times following prior programming of the bits.

It is difficult to know and/or predict an average threshold voltage for a distribution of data cells to be read (e.g., data cells in a codeword). When reading a codeword to determine data cells in, for example, a logic 1 or SET, an initial read voltage is selected that is sufficiently low so that data cells in a logic 0 or RESET state are not inadvertently disturbed (e.g., read disturb due to a large number of reads of adjacent memory cells) and then gradually increased higher in small steps as needed to complete a read operation. However, if the initial read voltage is selected to be too low, then gradual stepping of the read voltage to an adequately high voltage can require significant time. This can significantly increase the time required for read operations, and thus can reduce the read bandwidth for a memory device.

In some cases, a threshold voltage distribution of data cells (e.g., codewords) can be tracked using a set of known pattern (KP) cells. For example, KP cells or bits are used to track a distribution, and the KP bits are read in parallel during a read of the data cells. In one example, each codeword has additional KP bits, and the KP bits are programmed to logic 0 at the same time as the codeword is written. The KP bits may be a few cells (e.g., 8 cells). Also, the KP bits may be specific for each logic state (e.g., KP0 bits for level 0, and KP1 bits for level 1). During a read algorithm, the position of the data cell distribution can be determined by moving the read voltage step by step or with a ramp.

In some embodiments, a system includes a memory array including pattern cells and data cells. In some embodiments, the pattern cells are configured to store only a first logic state and the data cells are configured to store the first logic state or a second logic state. In some embodiments, the system includes bias circuitry configured to apply voltages to the pattern cells and data cells. In some embodiments, the system includes sensing circuitry configured to read the pattern cells. In some embodiments, the system includes a controller configured to apply, using the bias circuitry, first voltages to the pattern cells; determine, using the sensing circuitry, that at least a portion of the pattern cells switch; determine, based on the portion of the pattern cells that switch, to refresh a codeword; and apply, using the bias circuitry, the refresh of the codeword.

In some embodiments, the first voltages to the pattern cells are biased higher than a read voltage applied to the data cells.

In some embodiments, the controller is further configured to determine a logic state for each of the data cells.

In some embodiments, the controller is further configured to, using the bias circuitry, program at least a first portion of the data cells by changing each data cell of the first portion from the first logic state to the second logic state, or from the second logic state to the first logic state.

In some embodiments, the data cells store data for the codeword to be read from the memory array.

In some embodiments, the pattern cells are configured as a plurality of groups including a first group and a second group; and the codeword refresh is determined based on whether the first group or the second group has switched.

In some embodiments, the pattern cells are configured as a plurality of groups including a first group and a second group; and the codeword refresh is determined based on whether the first group and the second group have switched.

In some embodiments, the pattern cells are configured as a plurality of groups; and the codeword refresh is determined based on whether at least 50% of the plurality of groups has switched.

In some embodiments, the switching of a first group of the plurality of groups is determined based on whether a number of pattern cells in the first group that switch is greater than a threshold.

In some embodiments, the first logic state corresponds to a magnitude of threshold voltage that is greater than a magnitude of threshold voltage corresponding to the second logic state.

In some embodiments, the controller is further configured to receive a read command from a host device; and in response to receiving the read command, perform a read operation to retrieve data from the memory array.

In some embodiments, applying the first voltages to the pattern cells includes applying ramps in parallel to groups of the pattern cells.

In some embodiments, applying the first voltages to the pattern cells includes applying steps in parallel to groups of the pattern cells.

In some embodiments, a device includes a memory array including data cells and groups of pattern cells. In some embodiments, the device includes bias circuitry configured to apply voltages to the data cells and the groups of pattern cells. In some embodiments, the device includes sensing circuitry configured to read each of the pattern cells. In some embodiments, the device includes a controller configured to apply, using the bias circuitry, first voltages to the groups of pattern cells; determine, using the sensing circuitry, that at least a portion of the pattern cells switch; determine, based on the portion of the pattern cells that switch, to refresh a codeword; and apply, using the bias circuitry, the refresh of the codeword.

In some embodiments, the memory array has a vertical array architecture including vertical bitlines or digit lines intersecting a plurality of horizontal decks of wordlines.

In some embodiments, each deck is configured as two interdigitated wordline combs so that each bitline or digit line forms two cells at each of the decks.

In some embodiments, applying the first voltages includes applying a voltage greater than a read voltage applied to the data cells.

In some embodiments, the controller is further configured to determine a logic state for each of the data cells.

In some embodiments, the controller is further configured to, using the bias circuitry, program at least a first portion of the data cells by changing each data cell of the first portion from a first logic state to a second logic state, or from the second logic state to the first logic state.

In some embodiments, the first logic state corresponds to a magnitude of threshold voltage that is greater than a magnitude of threshold voltage corresponding to the second logic state.

Various advantages are provided by embodiments described herein. In one advantage, the use of higher voltages (e.g., voltages higher than for data cells) to read multiple groups of pattern cells reduces the time required for read operations. More quickly and/or accurately determining an initial read voltage reduces the number of voltage steps required for a read operation.

Figure 1:
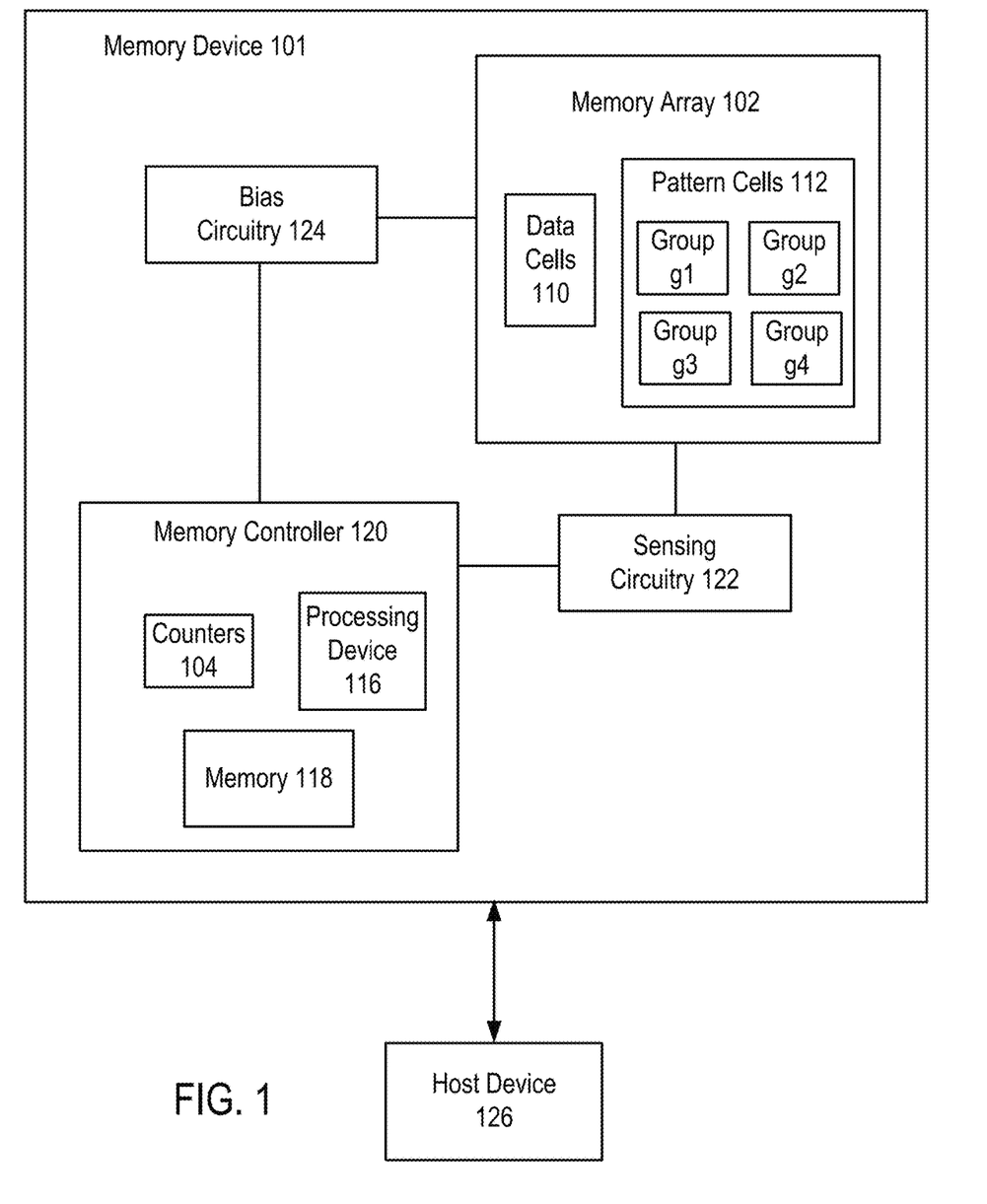
FIG. 1 shows a memory device that uses multiple patterns to determine when a refresh is needed, in accordance with some embodiments.

FIG. 1 shows a memory device 101 that uses multiple patterns to determine when a refresh is needed, in accordance with some embodiments. In one example, the multiple patterns are groups of pattern cells. Memory device 101 includes a memory array 102 having data cells 110 and pattern cells 112. The pattern cells 112 are organized into various groups g1, g2, g3, g4, as illustrated. Each of the groups includes memory cells of the same type as in other groups. Also, the memory cells in the groups are of the same type as the memory cells that store data (e.g., data cells 110). In one example, each of the groups includes a relatively small number of cells such as 5-8 cells as compared to the number of cells (e.g., 128 or 256) that provides a codeword.

Each of the pattern cells 112 is written or programmed to store only a first logic state that corresponds to a high voltage threshold magnitude. In one example, the first logic state is a logic zero (0) or RESET state for a positive polarity. Data cells 110 store data (e.g., user data for host device 126) in either the first logic state or a second logic state. The second logic state corresponds to a low voltage threshold magnitude. In one example, the second logic state is a logic one (1) or SET state for a positive polarity.

In one embodiment, pattern cells 112 are configured so that the pattern cells are programmed in the first logic state. In one example, each set of groups of pattern cells 112 is configured to correspond to a respective set of data cells 110. In one example, pattern cells 112 are in a same location of memory array 102 as data cells 110. In one example, the same location is the same tile or partition of memory array 102. In one example, the same location is a location on a same access line as data cells 110. In one example, the same location is on the same wordline as used to select data cells 110.

When performing a read operation, bias circuitry 124 applies voltages to pattern cells 112. In one example, bias circuitry 124 includes wordline and bitline drivers (not shown) to bias wordlines and bitlines of memory array 102.

Memory controller 120 determines which of the groups of pattern cells 112 switch. In one example, controller 120 determines that a group switches when a number of memory cells in the group that switch (e.g., threshold or snap) is greater than a threshold. In one example, the threshold is 50% or more of the memory cells in a group switching. Counters 104 can be used to count the number of memory cells that switch in a group of pattern cells 112 and/or a number of data cells 110 that switch when being read.

Sensing circuitry 122 is used to read pattern cells 112 and data cells 110. In one example, sensing circuitry 122 includes sense amplifiers for sensing a characteristic associated with memory cells of the memory array 102. The characteristic can be, for example, a voltage and/or current associated with a selected memory cell.

Controller 120 causes bias circuitry 124 to apply voltages to each group of the pattern cells 112. The voltages are applied in parallel so that each group can be sensed by sensing circuitry 122 simultaneously. In one example, the voltages are increasing magnitudes of voltage values (e.g., v(g1) applied to group g1, v(g2) applied to group g2, v(g3) applied to group g3, v(g4) applied to group g4) (e.g., +2, +2.5, +3, +3.5, +4, +4.5, +5 V) separated by steps (e.g., 0.5 V steps). In one example, the voltages are separated by equal steps. In one example, the voltages are separated by steps that vary in size. The variation in the size of the steps can be determined by controller 120 based on an operating context of memory device 101, such as an error rate or other characteristic associated with prior reading data cells of memory array 102.

After the voltages are applied to pattern cells 112, controller 120 determines which of the groups switch. Controller 120 uses data or signals from sensing circuitry 122 that indicate which pattern cells 112 have switched.

Based on determining which groups of pattern cells 112 switch, controller 120 determines whether to refresh the codeword.

Memory controller 120 includes one or more processing devices 116 and memory 118. In one example, memory 118 stores firmware executed by processing device 116 to select and apply the codeword refresh.

Sensing circuitry 122 can be used to sense a state of each memory cell in memory array 102. In one example, sensing circuitry 122 includes sense amplifiers used to detect a current caused by applying various voltages to memory cells in memory array 102. In one example, bias circuitry 124 applies a read voltage to data cells 110 or pattern cells 112. Sensing circuitry 122 senses a current associated with each of the data cells 110 or pattern cells 112 caused by applying the read voltage.

In one example, if sensing circuitry 122 determines that the current for a memory cell is greater than a fixed threshold (e.g., a predetermined level of current), then memory controller 120 determines that the memory cell has switched (e.g., snapped).

In one embodiment, memory controller 120 receives a write command from a host device 126. The write command is accompanied by data (e.g., user data of a user of host device 126) to be written to memory array 102. In response to receiving the write command, controller 120 initiates a programming operation.

In one embodiment, controller 120 uses one of counters 104 to count the number of data or pattern cells that snap as a read voltage is applied.

In one example, after being accessed (e.g., selected), a memory cell may be read, or sensed, by a sense component (e.g., sensing circuitry 122) to determine the stored state of the memory cell. For example, a voltage may be applied to the memory cell (using a wordline and bitline) and the presence of a resulting current may depend on the applied voltage and the threshold voltage of the memory cell. In some cases, more than one voltage may be applied. Additionally, if an applied voltage does not result in current flow, other voltages may be applied until a current is detected by the sense component. By assessing the voltage that resulted in current flow, the stored logic state of the memory cell may be determined. In some cases, the voltage may be ramped up in magnitude until a current flow is detected (e.g., a memory cell turns on, switches on, conducts current, or becomes activated). In other cases, predetermined voltages may be applied sequentially until a current is detected. Likewise, a current may be applied to a memory cell, and the magnitude of the voltage to create the current may depend on the electrical resistance or the threshold voltage of the memory cell.

In some cases, the memory cell (e.g., a PCM cell) includes a material that changes its crystallographic configuration (e.g., between a crystalline phase and an amorphous phase), which in turn, determines a threshold voltage of the memory cell to store information. In other cases, the memory cell includes a material that remains in a crystallographic configuration (e.g., an amorphous phase) that may exhibit variable threshold voltages to store information.

The sense component may include various transistors or amplifiers in order to detect and amplify a difference in the signals. The detected logic state of the memory cell may then be output through a column decoder as output. In some cases, the sense component may be part of a column decoder or a row decoder.

Figure 2:
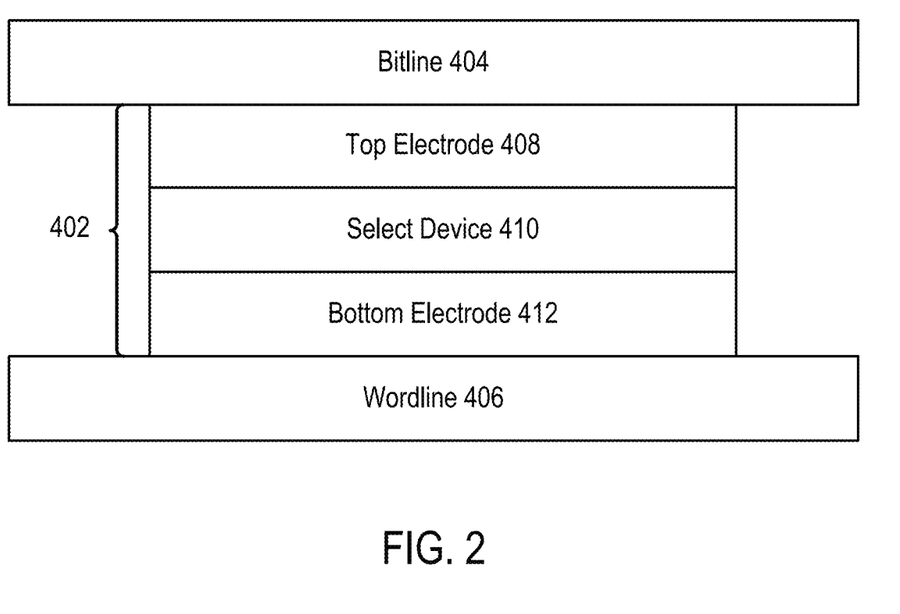
FIG. 2 shows an example of a memory cell that includes a select device, in accordance with some embodiments.

FIG. 2 shows an example of a memory cell 402 that includes a select device, in accordance with some embodiments. In one example, select device 410 includes a chalcogenide. Memory cell 402 is an example of data cells 110 and/or pattern cells 112.

Top electrode 408 conductively connects select device 410 to bitline 404, and bottom electrode 412 conductively connects select device 410 to wordline 406. In one example, electrodes 408, 412 are formed of a carbon material.

In one example, select device 410 includes a chalcogenide (e.g., chalcogenide material and/or chalcogenide alloy). Threshold voltage properties of the select device may be based on the voltage polarities applied to the memory cell.

In one example, a logic state may be written to memory cell 402, which may correspond to one or more bits of data. A logic state may be read from or written to the memory cell by applying voltages of different polarities at different voltage and/or current magnitudes. The reading and writing protocols may take advantage of different threshold voltages of the select device that result from the different polarities. In other words, when the memory cell is a self-selecting memory cell implemented using a selector/memory device, the select device 410 may be used as both a selecting element and a storage element of the cell 402.

Figure 3:
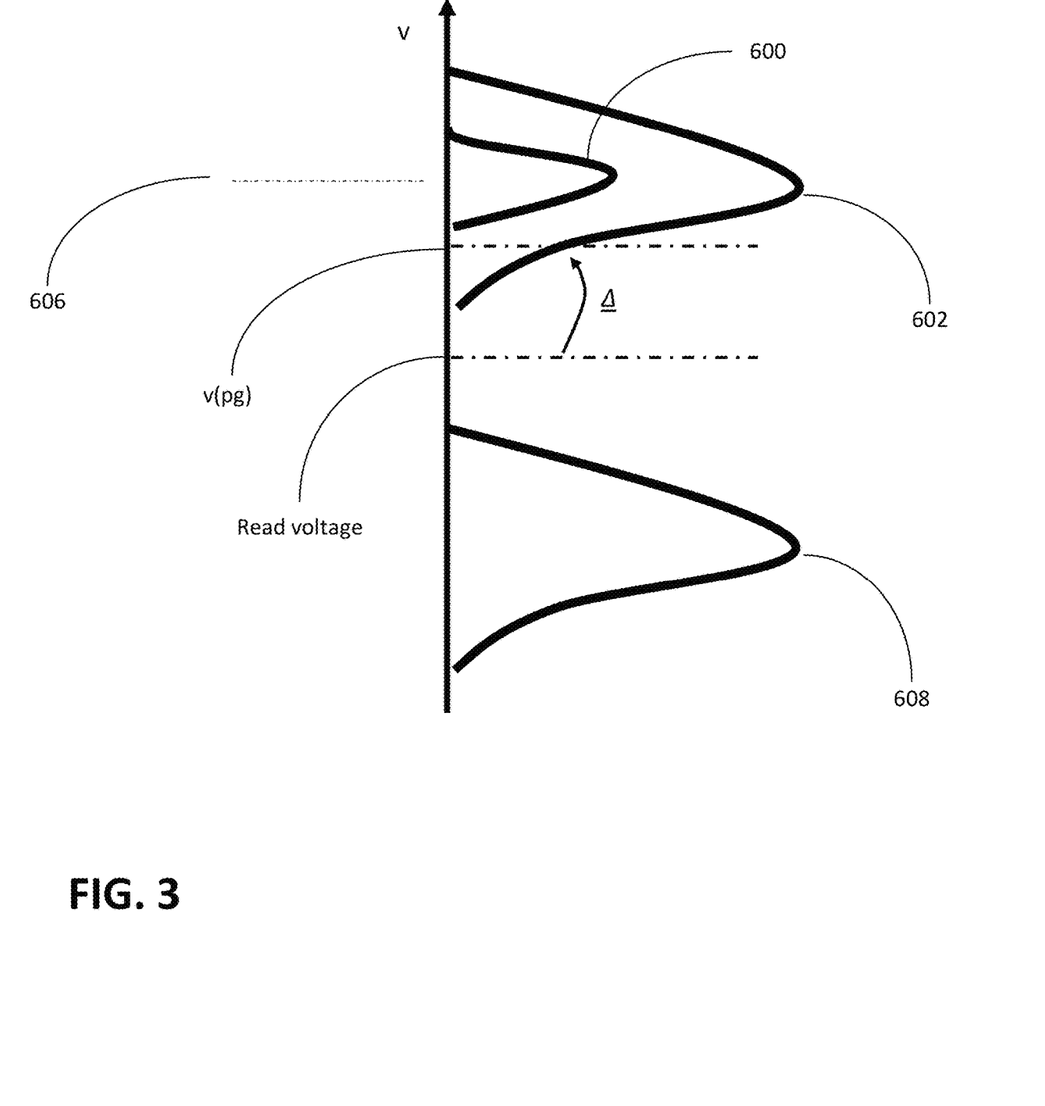
FIG. 3 shows an exemplary pattern cell distribution for a refresh pattern in a memory array, in accordance with some embodiments.

FIG. 3 shows an exemplary pattern cell distribution 600 for a refresh pattern in a memory array, in accordance with some embodiments. In one example, the memory array is memory array 102.

Pattern cell distribution 600 illustrates a number (horizontal axis) of memory cells distributed relative to voltage (vertical axis). A voltage, v(pg), can be applied to a group of pattern cells. The data cell distribution 602 of data cells having a zero is also shown to illustrate that the pattern cell distribution 600 is narrower than the main distribution 602. In some embodiments, the voltage v(pg) is greater than a read voltage 606 by an amount A. In some embodiments, the vertical axis also shows the voltage that is applied starting at the voltage v(pg) and increasing in magnitude to a point which corresponds to a time at which 50% of the pattern cells have switched. A cell switches if or when the voltage is greater than or equal to a threshold. Thus, in some embodiments, a pattern cell in the pattern cell distribution 600 switches when the pattern cell has a voltage greater than or equal to the average threshold voltage 606 because the pattern cell distribution 600 has the same average of the codeword distribution as the data cell distribution 602.

A controller determines whether a codeword refresh is needed based on the switching of at least 50% of the pattern cells. Average threshold voltage 606 is used by the controller as a proxy for, or prediction of, the 0 cell threshold voltage distribution of data cells to be read.

In one embodiment, a group of pattern cells switching implies that a refresh of the codeword is needed or the data stored in the data cells may be compromised. Thus, it is possible to improve a timing of a codeword refresh by observing the switching of the pattern cells. FIG. 3 also shows an exemplary data cell distribution 608 for a data cell having a logic 1.

Figure 4:
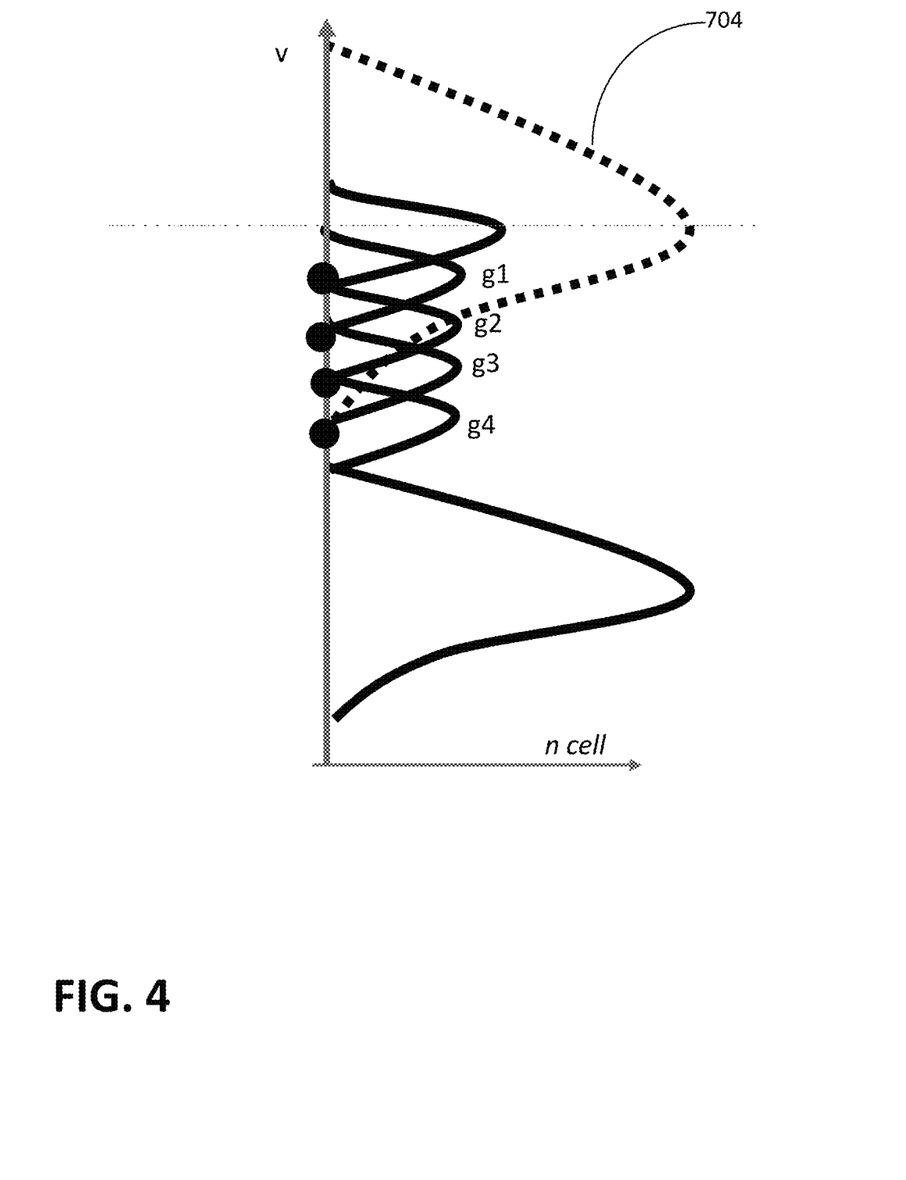
FIG. 4 shows exemplary pattern cell distributions (e.g., for groups g1, g2, g3, g4) relative to a data cell (logic 0) distribution, in accordance with some embodiments.

FIG. 4 shows exemplary pattern cell distributions (e.g., for groups g1, g2, g3, g4) relative to a data cell (logic 0) distribution 704, in accordance with some embodiments. In one embodiment, a multi-pattern structure is used (e.g., 4 groups of pattern cells of the same type and same number of cells in each group).

As illustrated in FIG. 4, all pattern cells have the same average (or substantially the same average) threshold voltage of the data cells corresponding to data cell distribution 704 because the data cells and pattern cells are of the same type. Increasing the voltage applied on a group g(i) with respect to the voltage applied to the data cells, the voltage applied to the group and to the data cells is the same. However, each group g(i) has an average threshold voltage lower to an extent equal to the difference between the read voltage and the voltage vg(i) applied to the group i.

In one example, there are 4 groups g1, g2, g3, g4 that have different average threshold voltages relative to the logic 0 cell distribution 704 of the codeword. In such embodiments, the switching of the groups g1, g2, g3, g4 determines whether a codeword refresh is needed. For example, in some embodiments, at least 50% of the groups g1, g2, g3, g4 should be switched in order to refresh the codeword. In some embodiments, the 50% threshold can be modified to be a different number greater than or less than 50%. In some embodiments, even with a threshold set at 50%, if less than 50% of the groups g1, g2, g3, g4 have switched, the codeword may be stored in a cache and refreshed once the 50% threshold is reached. In some embodiments, one or more of the groups g1, g2, g3, g4 can be controlling. For example, if g4 is switched, then the codeword can be refreshed regardless of the 50% threshold being reached. Conversely, if g1 is switched, but the 50% threshold is not reached, then the codeword may not be refreshed until the 50% threshold is reached or a determinative group g1, g2, g3, g4 is switched.

Figure 5:
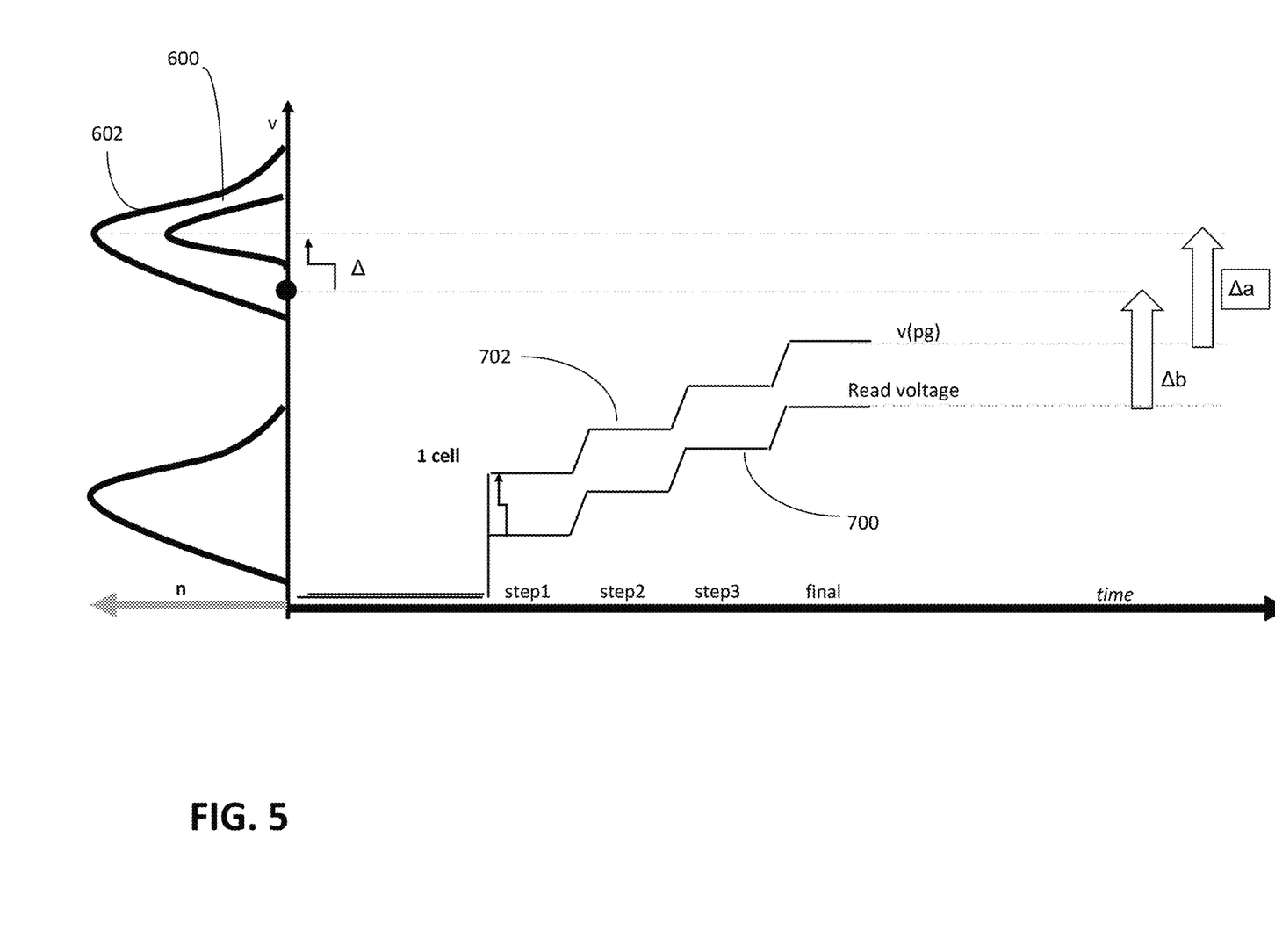
FIG. 5 shows voltages over time for a pattern cell distribution as compared to a data cell distribution during a read of the pattern cells or the data cells, according to some embodiments.

FIG. 5 shows voltages over time for a pattern cell distribution 600 as compared to a data cell distribution 602 during a read of the pattern cells or the data cells, according to some embodiments.

The read voltage 700 is applied in multiple steps until the final read voltage 700 is reached. Similarly, the read voltage 702 of the pattern cells, v(pg), is applied in multiple steps until the final read voltage of the pattern cells v(pg) is reached. The read voltage 700 and the read voltage 702 are offset by an amount Δ. As a result, a voltage difference Δa between the average and the read voltage 700 is the same as a voltage difference Δb between the read voltage 702 and a threshold voltage for a data cell having a threshold voltage offset by an amount Δ lower than the average of the data cell distribution 602. In some embodiments, the amount Δ is the difference between the read voltage 702 of the pattern cells and the read voltage 700. Accordingly, Δb can be used in determining an appropriate time to refresh the codeword since Δa and Δb are the same because a pattern cell placed on the average of pattern cell distribution 600 will experience the same disturb of a hypothetical cell an amount Δ lower than the average.

The illustrated embodiment shows that the read of the pattern cells and the read of the data cells utilizes a stepped application of the read voltages. It is to be appreciated that the concepts described herein can also be applied to a ramped application of the read voltages.

Figure 6:
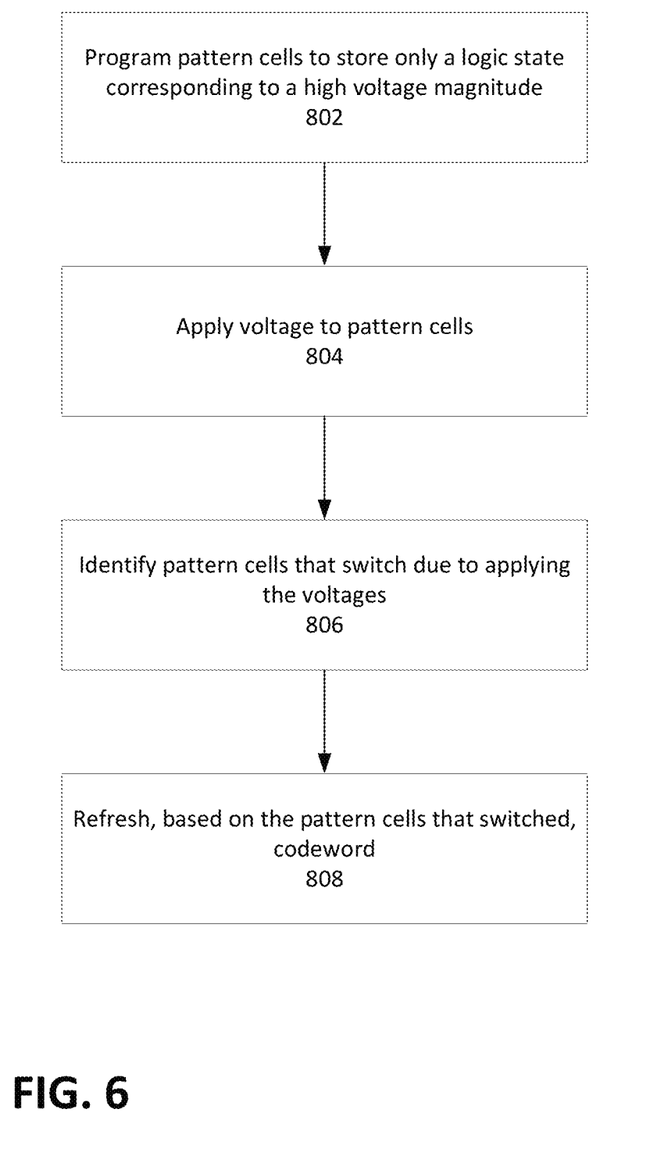
FIG. 6 shows a method for refreshing a codeword for memory cells, in accordance with some embodiments.

FIG. 6 shows a method for refreshing a codeword for memory cells, in accordance with some embodiments. For example, the method of FIG. 6 can be implemented in the system of FIG. 1.

The method of FIG. 6 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 6 is performed at least in part by one or more processing devices (e.g., controller 120 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 802, pattern cells are programmed to store only a logic state (e.g., logic 0, or RESET state) corresponding to a high threshold voltage magnitude. In one example, pattern cells 112 are programmed to a logic 0 state. In one example, the pattern cells are programmed prior to performing a read operation on one or more codewords.

At block 804, voltages are applied to groups of the pattern cells. In one example, pattern ramps are applied to each of different groups of pattern cells. In one example, each of the ramps is applied to a respective group at different voltages. In one example, the different voltages are separated by at least 0.2-0.6 V at any given time during ramping (e.g., while applying the ramps to the pattern cells).

At block 806, those of the groups that switch due to applying the voltages are identified. In one example, a controller determines that group g2 switches first (e.g., at a lower magnitude of the applied voltages than for later groups g3, g4 that also switch).

At block 808, in response to the switching, a refresh of the codeword for the corresponding data cells to the pattern cells is completed.

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A system comprising:
a memory array comprising pattern cells and data cells, wherein each of the pattern cells is configured to store only a first logic state;
sensing circuitry configured to read the pattern cells; and
a controller configured to:
store a codeword in the data cells;
apply first voltages to the pattern cells;
determine, using the sensing circuitry, that at least a portion of the pattern cells switch;
determine, based on the portion of the pattern cells that switch, to refresh the codeword; and
apply the refresh of the codeword.

2. The system of claim 1, wherein the first voltages to the pattern cells are biased higher than a read voltage applied to the data cells.

3. The system of claim 1, wherein the controller is further configured to determine a logic state for each of the data cells.

4. The system of claim 3, wherein the controller is further configured to, using bias circuitry, program at least a first portion of the data cells by changing a logic state of each data cell of the first portion.

5. The system of claim 1, wherein:
the pattern cells are configured as a plurality of groups including a first group and a second group; and
the codeword refresh is determined based on whether the first group or the second group has switched.

6. The system of claim 1, wherein:
the pattern cells are configured as a plurality of groups including a first group and a second group; and
the codeword refresh is determined based on whether the first group and the second group have switched.

7. The system of claim 1, wherein:
the pattern cells are configured as a plurality of groups; and
the codeword refresh is determined based on whether at least 50% of the plurality of groups has switched.

8. The system of claim 7, wherein the switching of a first group of the plurality of groups is determined based on whether a number of pattern cells in the first group that switch is greater than a threshold.

9. The system of claim 1, wherein:
each of the data cells is configured to store the first logic state or a second logic state; and
the first logic state corresponds to a magnitude of threshold voltage that is greater than a magnitude of threshold voltage corresponding to the second logic state.

10. The system of claim 1, wherein the controller is further configured to:

receive a read command from a host device; and in response to receiving the read command, perform a read operation to retrieve data from the memory array.

11. The system of claim 1, wherein:

applying the first voltages to the pattern cells comprises applying ramps in parallel to groups of the pattern cells.

12. The system of claim 1, wherein:

applying the first voltages to the pattern cells comprises applying steps in parallel to groups of the pattern cells.

13. The system of claim 1, wherein:

applying the first voltages to the pattern cells comprises applying a voltage to a single group of the pattern cells; and the voltage applied to the single group is higher than a read voltage applied to the data cells.

14. The system of claim 1, wherein:

applying the first voltages to the pattern cells comprises applying different respective voltages to each of multiple groups of the pattern cells; and the respective voltage for each group is higher than a read voltage applied to the data cells.

15. A device comprising:

a memory array comprising data cells and pattern cells, wherein each of the pattern cells is configured to store only a first logic state; and a controller configured to:

store a codeword in the data cells;

apply first voltages to the pattern cells;

determine that at least a portion of the pattern cells switch;

determine, based on the portion of the pattern cells that switch, to refresh the codeword; and apply the refresh of the codeword.

16. The device of claim 15, wherein the memory array has a vertical array architecture comprising vertical bitlines or digit lines intersecting a plurality of horizontal decks of wordlines.

17. The device of claim 16, wherein each deck is configured as two interdigitated wordline combs so that each bitline or digit line forms two cells at each of the decks.

18. The device of claim 15, wherein applying the first voltages comprises applying a voltage greater than a read voltage applied to the data cells.

19. The device of claim 15, wherein the controller is further configured to determine a logic state for each of the data cells.

20. The device of claim 19, wherein the controller is further configured to, using bias circuitry, program at least a first portion of the data cells by changing each data cell of the first portion from the first logic state to a second logic state, or from the second logic state to the first logic state.

21. The device of claim 20, wherein the first logic state corresponds to a magnitude of threshold voltage that is greater than a magnitude of threshold voltage corresponding to the second logic state.

\* \* \* \* \*